United States Patent
Lu et al.

(10) Patent No.: US 9,570,381 B2
(45) Date of Patent: Feb. 14, 2017

(54) SEMICONDUCTOR PACKAGES AND RELATED MANUFACTURING METHODS

(71) Applicant: Advanced Semiconductor Engineering, Inc., Kaohsiung (TW)

(72) Inventors: Chun-Ting Lu, Kaohsiung (TW); Chun-Hung Lin, Kaohsiung (TW); Yi-Ting Chen, Kaohsiung (TW)

(73) Assignee: ADVANCED SEMICONDUCTOR ENGINEERING, INC., Kaosiung (TW)

( * ) Notice: Subject to any disclaimer, the term of this patent is extended or adjusted under 35 U.S.C. 154(b) by 0 days.

(21) Appl. No.: 14/677,863

(22) Filed: Apr. 2, 2015

(65) Prior Publication Data
US 2016/0293531 A1    Oct. 6, 2016

(51) Int. Cl.
*H01L 23/49*    (2006.01)
*H01L 23/495*    (2006.01)
(Continued)

(52) U.S. Cl.
CPC ..... *H01L 23/49586* (2013.01); *H01L 21/4803* (2013.01); *H01L 21/4825* (2013.01);
(Continued)

(58) Field of Classification Search
CPC ............ H01L 23/5227; H01L 23/5226; H01L 27/092; H01L 23/49586; H01L 23/3107; H01L 23/49503; H01L 21/4803; H01L 21/4825

See application file for complete search history.

(56) References Cited

U.S. PATENT DOCUMENTS

| 5,200,025 A | 4/1993 | Toei et al. |
| 5,331,200 A * | 7/1994 | Teo .......... H01L 23/49551 257/666 |

(Continued)

FOREIGN PATENT DOCUMENTS

| CN | 2726111 | 9/2005 |
| CN | 1735963 | 2/2006 |

(Continued)

OTHER PUBLICATIONS

Chien et al., U.S. Appl. No. 12/192,702, filed Aug. 15, 2008 for "Advanced Quad Flat No Lead Chip Package Having a Cavity Structure and Manufacturing Methods Thereof." Office Action mailed Nov. 17, 2010.

(Continued)

*Primary Examiner* — Nathan W Ha
(74) *Attorney, Agent, or Firm* — Foley & Lardner LLP; Cliff Z. Liu

(57) ABSTRACT

Described herein are semiconductor packages having an insulating layer and the manufacturing methods thereof, wherein semiconductor packages include a die pad; a plurality of leads surrounding the die pad, wherein each of the leads comprises an inner lead portion and an outer lead portion, and wherein at least one lead further comprises a trace portion; a chip disposed on the die pad and electrically connected to the leads; a molding compound encapsulating the chip, the inner lead portions and the trace portion, where the outer lead portions and a first surface of the trace portion are exposed from the molding compound; and an insulating layer covering the first surface of the trace portion.

18 Claims, 11 Drawing Sheets

(51) Int. Cl.
*H01L 23/31* (2006.01)
*H01L 21/48* (2006.01)
*H01L 21/56* (2006.01)

(52) U.S. Cl.
CPC ........ *H01L 21/4828* (2013.01); *H01L 21/565* (2013.01); *H01L 23/3107* (2013.01); *H01L 23/49503* (2013.01)

(56) References Cited

U.S. PATENT DOCUMENTS

| | | | |
|---|---|---|---|
| 5,389,739 A | 2/1995 | Mills | |
| 5,800,958 A | 9/1998 | Manteghi | |
| 5,847,458 A | 12/1998 | Nakamura et al. | |
| 5,900,676 A | 5/1999 | Kweon et al. | |
| 5,969,412 A | 10/1999 | Matsutomo | |
| 6,001,671 A | 12/1999 | Fjelstad | |
| 6,093,584 A | 7/2000 | Fjelstad | |
| 6,201,292 B1 | 3/2001 | Yagi et al. | |
| 6,238,952 B1 | 5/2001 | Lin | |
| 6,242,284 B1 | 6/2001 | Kang et al. | |
| 6,261,864 B1 | 7/2001 | Jung et al. | |
| 6,291,271 B1 | 9/2001 | Lee et al. | |
| 6,303,985 B1 | 10/2001 | Larson et al. | |
| 6,306,685 B1 | 10/2001 | Liu et al. | |
| 6,333,252 B1 | 12/2001 | Jung et al. | |
| 6,342,730 B1 | 1/2002 | Jung et al. | |
| 6,410,987 B1 | 6/2002 | Kanemoto et al. | |
| 6,424,047 B1 | 7/2002 | Chua et al. | |
| 6,429,536 B1 | 8/2002 | Liu et al. | |
| 6,451,627 B1 | 9/2002 | Coffman | |
| 6,495,909 B2 | 12/2002 | Jung et al. | |
| 6,498,099 B1 | 12/2002 | McLellan et al. | |
| 6,501,162 B2 | 12/2002 | Sakamoto et al. | |
| 6,525,406 B1 | 2/2003 | Chung et al. | |
| 6,528,879 B2 | 3/2003 | Sakamoto et al. | |
| 6,528,893 B2 | 3/2003 | Jung et al. | |
| 6,545,347 B2 | 4/2003 | McClellan | |
| 6,545,737 B2 | 4/2003 | Hasegawa et al. | |
| 6,548,328 B1 | 4/2003 | Sakamoto et al. | |
| 6,551,859 B1 | 4/2003 | Lee et al. | |
| 6,562,660 B1 | 5/2003 | Sakamoto et al. | |
| 6,585,905 B1 | 7/2003 | Fan et al. | |
| 6,586,677 B2 | 7/2003 | Glenn | |
| 6,635,956 B2 | 10/2003 | Sakamoto et al. | |
| 6,635,957 B2 | 10/2003 | Kwan et al. | |
| 6,683,368 B1 | 1/2004 | Mostafazadeh | |
| 6,689,640 B1 | 2/2004 | Mostafazadeh | |
| 6,700,188 B2 | 3/2004 | Lin | |
| 6,706,547 B2 | 3/2004 | Sakamoto et al. | |
| 6,713,849 B2 | 3/2004 | Hasebe et al. | |
| 6,740,961 B1 | 5/2004 | Mostafazadeh | |
| 6,759,271 B2 | 7/2004 | Miyazaki | |
| 6,812,063 B2 | 11/2004 | Huang | |
| 6,812,410 B2 | 11/2004 | Sakamoto et al. | |
| 6,812,552 B2 | 11/2004 | Islam et al. | |
| 6,861,295 B2 | 3/2005 | Jung et al. | |
| 6,861,734 B2 | 3/2005 | Minamio et al. | |
| 6,927,483 B1 | 8/2005 | Lee et al. | |
| 6,946,324 B1 | 9/2005 | McLellan et al. | |
| 6,975,022 B2 | 12/2005 | Sakamoto et al. | |
| 6,975,038 B1 | 12/2005 | Mostafazadeh | |
| 6,984,880 B2 | 1/2006 | Minamio et al. | |
| 6,993,594 B2 | 1/2006 | Schneider | |
| 6,995,459 B2 | 2/2006 | Lee et al. | |
| 6,995,460 B1 | 2/2006 | McLellan et al. | |
| 7,026,190 B2 | 4/2006 | Kobayashi et al. | |
| 7,049,177 B1 | 5/2006 | Fan et al. | |
| 7,060,535 B1 | 6/2006 | Sirinorakul et al. | |
| 7,091,606 B2 | 8/2006 | Sakamoto et al. | |
| 7,095,100 B2 | 8/2006 | Kasuya | |
| 7,125,798 B2 | 10/2006 | Sakamoto et al. | |
| 7,129,116 B2 | 10/2006 | Islam et al. | |
| 7,145,222 B2 | 12/2006 | Gai | |
| 7,166,495 B2 | 1/2007 | Ball | |
| 7,173,336 B2 | 2/2007 | Sakamoto et al. | |
| 7,193,302 B2 | 3/2007 | Tseng | |
| 7,208,826 B2 | 4/2007 | Sakamoto et al. | |
| 7,215,009 B1 | 5/2007 | Leng et al. | |
| 7,224,066 B2 | 5/2007 | Naruse et al. | |
| 7,226,811 B1 | 6/2007 | McLellan et al. | |
| 7,235,888 B2 | 6/2007 | Hosokawa et al. | |
| 7,247,526 B1 | 7/2007 | Fan et al. | |
| 7,247,938 B2 | 7/2007 | Groenhuis et al. | |
| 7,262,491 B2 | 8/2007 | Islam et al. | |
| 7,271,032 B1 | 9/2007 | McLellan et al. | |
| 7,344,920 B1 | 3/2008 | Kirloskar et al. | |
| 7,348,663 B1 | 3/2008 | Kirloskar et al. | |
| 7,351,612 B2 | 4/2008 | Gai | |
| 7,382,044 B1 | 6/2008 | Yilmaz et al. | |
| 7,407,834 B2 | 8/2008 | Shimanuki et al. | |
| 7,410,834 B2 | 8/2008 | Fukaya et al. | |
| 7,443,012 B2 | 10/2008 | Yamaguchi | |
| 7,446,397 B2 | 11/2008 | Gai | |
| 7,459,347 B2 | 12/2008 | Shimanuki et al. | |
| 7,518,156 B2 | 4/2009 | Hasebe et al. | |
| 7,550,322 B2 | 6/2009 | Kimura | |
| 7,563,648 B2 | 7/2009 | Islam et al. | |
| 7,598,606 B2 | 10/2009 | Chow et al. | |
| 7,602,053 B2 | 10/2009 | Huang et al. | |
| 7,608,482 B1 | 10/2009 | Bayan | |
| 7,622,332 B2 | 11/2009 | Islam et al. | |
| 7,679,172 B2 | 3/2010 | Huang et al. | |
| 7,683,461 B2 | 3/2010 | Lau | |
| 7,786,557 B2 | 8/2010 | Hsieh et al. | |
| 7,790,500 B2 | 9/2010 | Ramos et al. | |
| 7,799,611 B2 | 9/2010 | Ramos et al. | |
| 7,834,469 B2 | 11/2010 | Chuang et al. | |
| 8,390,118 B2 | 3/2013 | Lin et al. | |
| 2001/0052600 A1 | 12/2001 | Sakamoto et al. | |
| 2002/0160552 A1 | 10/2002 | Minamio et al. | |
| 2003/0071333 A1 | 4/2003 | Matsuzawa | |
| 2003/0092205 A1 | 5/2003 | Wu et al. | |
| 2003/0170922 A1 | 9/2003 | Sakamoto et al. | |
| 2004/0046237 A1 | 3/2004 | Abe et al. | |
| 2004/0094829 A1 | 5/2004 | Minamio et al. | |
| 2004/0217450 A1 | 11/2004 | Li et al. | |
| 2005/0023667 A1 | 2/2005 | Lin et al. | |
| 2005/0146058 A1 | 7/2005 | Danno | |
| 2006/0240600 A1 | 10/2006 | Ito et al. | |
| 2007/0018291 A1 | 1/2007 | Huang et al. | |
| 2007/0052076 A1 | 3/2007 | Ramos et al. | |
| 2007/0059863 A1 | 3/2007 | Li et al. | |
| 2007/0085199 A1 | 4/2007 | Ong et al. | |
| 2007/0146611 A1 | 6/2007 | Kang | |
| 2007/0164403 A1 | 7/2007 | Huang et al. | |
| 2007/0181983 A1 | 8/2007 | Takai et al. | |
| 2007/0194417 A1 | 8/2007 | Yoshida et al. | |
| 2008/0029855 A1 | 2/2008 | Chang | |
| 2008/0067649 A1 | 3/2008 | Matsunaga et al. | |
| 2008/0079124 A1 | 4/2008 | Haga et al. | |
| 2008/0093715 A1 | 4/2008 | Lange et al. | |
| 2008/0179758 A1 | 7/2008 | Wong et al. | |
| 2008/0258278 A1 | 10/2008 | Ramos et al. | |
| 2008/0311705 A1 | 12/2008 | Kim | |
| 2009/0001540 A1 | 1/2009 | Yang et al. | |
| 2009/0065914 A1 | 3/2009 | Engl | |
| 2009/0189260 A1 | 7/2009 | Hasebe et al. | |
| 2009/0230523 A1 | 9/2009 | Chien et al. | |
| 2009/0230524 A1 | 9/2009 | Chien et al. | |
| 2009/0230525 A1 | 9/2009 | Chien et al. | |
| 2009/0230526 A1 | 9/2009 | Chen et al. | |
| 2009/0267210 A1 | 10/2009 | Chuang | |
| 2009/0278243 A1 | 11/2009 | Chuang | |
| 2009/0283884 A1* | 11/2009 | Kang | H01L 21/4832 257/676 |
| 2010/0044843 A1 | 2/2010 | Chien et al. | |
| 2010/0044850 A1 | 2/2010 | Lin et al. | |
| 2010/0258920 A1 | 10/2010 | Chien et al. | |
| 2010/0258921 A1 | 10/2010 | Chien et al. | |
| 2010/0258934 A1 | 10/2010 | Chien et al. | |
| 2011/0309375 A1* | 12/2011 | Kato | H01L 21/565 257/77 |
| 2012/0104584 A1 | 5/2012 | Chen et al. | |

(56) References Cited

U.S. PATENT DOCUMENTS

| | | | |
|---|---|---|---|
| 2012/0280377 A1* | 11/2012 | Do | H01L 21/4832 257/676 |
| 2013/0105956 A1* | 5/2013 | Jo | H01L 23/4334 257/676 |
| 2013/0154072 A1* | 6/2013 | Do | H01L 23/49541 257/676 |
| 2013/0285222 A1* | 10/2013 | Park | H01L 23/495 257/676 |
| 2014/0165389 A1* | 6/2014 | Do | H01L 21/4825 29/825 |
| 2014/0167236 A1* | 6/2014 | Do | H01L 23/3128 257/676 |

FOREIGN PATENT DOCUMENTS

| | | |
|---|---|---|
| CN | 101587868 | 11/2009 |
| JP | 11195733 | 7/1999 |
| JP | 2001024135 | 1/2001 |
| JP | 2005166985 | 6/2005 |
| JP | 2005317998 | 11/2005 |

OTHER PUBLICATIONS

Chien et al., U.S. Appl. No. 12/192,742, filed Aug. 15, 2008 for "Semiconductor Chip Package Having Ground and Power Regions and Manufacturing Methods Thereof."

Chien et al., U.S. Appl. No. 12/192,761, filed Aug. 15, 2008 for "Advanced Quad Flat No Lead Chip Package Having Marking and Corner Lead Features and Manufacturing Methods Thereof."

Chen et al., U.S. Appl. No. 12/192,805, filed Aug. 15, 2008 for "Advanced Quad Flat No Lead Chip Package Having a Protective Layer to Enhance Surface Mounting and Manufacturing Methods Thereof." Office Action mailed May 27, 2010.

Lee et al., U.S. Appl. No. 12/683,426, filed Jan. 6, 2010 for "Leadframe Structure, Advanced Quad Flat No Lead Package Structure Using the Same and Manufacturing Methods Thereof."

Chuang, et al., U.S. Appl. No. 12/428,762, filed Apr. 23, 2009 for "Integrated Circuit Package Having a Stacked Die Structure and Manufacturing Method Thereof." Office Actions mailed Jun. 24, 2010, Dec. 8, 2010.

* cited by examiner

SEMICONDUCTOR PACKAGES AND RELATED MANUFACTURING METHODS

TECHNICAL FIELD

The present disclosure relates, in general, to quad flat no-lead (QFN) semiconductor packages and, more particularly, to QFN semiconductor packages having an insulating layer, and the manufacturing methods thereof.

BACKGROUND

A QFN package is a type of semiconductor device package having short signal traces. The short signal traces may allow for fast signal transmission speeds. Therefore, QFN packages are suitable for chip packages with high frequency transmission (e.g. high frequency transmission through the RF bandwidth). An improved QFN semiconductor package is described in this disclosure.

SUMMARY

The present disclosure is directed to QFN semiconductor packages having an insulating layer, and the manufacturing methods thereof.

One aspect of the present disclosure relates to semiconductor packages. In one embodiment, a semiconductor package comprises: a die pad; a plurality of leads surrounding the die pad, wherein each of the leads comprises an inner lead portion and an outer lead portion, and wherein at least one lead further comprises a trace portion; a chip disposed on the die pad and electrically connected to ones of the leads; a molding compound encapsulating the chip, the inner lead portions and the trace portion, where the outer lead portions and a first surface of the trace portion are exposed from the molding compound; and an insulating layer covering the first surface of the trace portion. The outer lead portion may protrude from the bottom of the molding compound.

In another embodiment, a semiconductor package comprises: a die pad; a plurality of leads surrounding the die pad, wherein each of the leads comprises an inner lead portion and an outer lead surface, and wherein at least one lead further comprises a trace portion; a chip disposed on the die pad and electrically connected to the leads; a molding compound encapsulating the chip, the inner lead portions and the trace portion, where the outer lead surfaces and a first surface of the trace portion are exposed from the molding compound; and an insulating layer covering the first surface of the trace portion The outer lead surfaces may be substantially coplanar with the bottom of the molding compound.

Another aspect of the disclosure relates to electronic devices. In one embodiment, an electronic device comprises: a semiconductor package, comprising a die pad; a plurality of leads surrounding the die pad, wherein each of the leads comprises an inner lead portion and an outer lead portion, and wherein at least one lead further comprises a trace portion; a chip disposed on the die pad and electrically connected to the leads; a molding compound encapsulating the chip, the inner lead portions and the trace portion, where the outer lead portions and a first surface of the trace portion are exposed from the molding compound; and an insulating layer covering the first surface of the trace portion; wherein the outer lead portion protrudes from the bottom of the molding compound; and a printed circuit board attached to the semiconductor package and electrically connected to the semiconductor package.

In another embodiment, an electronic device comprises: a semiconductor package, comprising a die pad; a plurality of leads surrounding the die pad, wherein each of the leads comprises an inner lead portion and an outer lead surface, and wherein at least one lead further comprises a trace portion; a chip disposed on the die pad and electrically connected to the leads; a molding compound encapsulating the chip, the inner lead portions and the trace portion, where the outer lead surfaces and a first surface of the trace portion are exposed from the molding compound; and an insulating layer covering the first surface of the trace portion; wherein the outer lead surface is an exposed surface substantially coplanar with the bottom of the molding compound; and a printed circuit board attached to the semiconductor package and electrically connected to the semiconductor package.

Another aspect of the present disclosure relates to manufacturing methods. In one embodiment, a method of manufacturing a semiconductor package comprises (1) providing a lead frame comprising a die pad and a plurality of leads; (2) disposing a chip on the die pad; (3) electrically connecting the chip to the lead frame; (4) forming a molding compound encapsulating the chip and partially encapsulating the leads; (5) etching the lead frame such that each of the leads comprises an inner lead portion and an outer lead portion, wherein at least one lead comprises a trace portion, and the outer lead portions and a first surface of the trace portion are exposed from the molding compound; and (6) forming an insulating layer on the first surface of the trace portion. The outer lead portion may protrude from the bottom of the molding compound.

In another embodiment, a method of manufacturing a semiconductor package comprises (1) providing a lead frame comprising a die pad and a plurality of leads; (2) disposing a chip on the die pad; (3) electrically connecting the chip to the lead frame; (4) forming a molding compound encapsulating the chip and partially encapsulating the leads; (5) etching the lead frame such that each of the leads comprises an inner lead portion and an outer lead surface, wherein at least one lead comprises a trace portion, and the outer lead surfaces and a first surface of the trace portion are exposed from the molding compound; and (6) forming an insulating layer on the first surface of the trace portion. The outer lead surface may be substantially coplanar with the bottom of the molding compound.

Other aspects and embodiments of the present disclosure are also contemplated. The foregoing summary and the following detailed description are not meant to restrict the present disclosure to any particular embodiment but are merely meant to describe some embodiments of the present disclosure.

BRIEF DESCRIPTION OF THE DRAWINGS

For a better understanding of the nature and objects of some embodiments of the present disclosure, reference should be made to the following detailed description taken in conjunction with the accompanying drawings. In the drawings, like reference numbers denote like elements, unless the context clearly dictates otherwise.

DETAILED DESCRIPTION

Figure 1A:
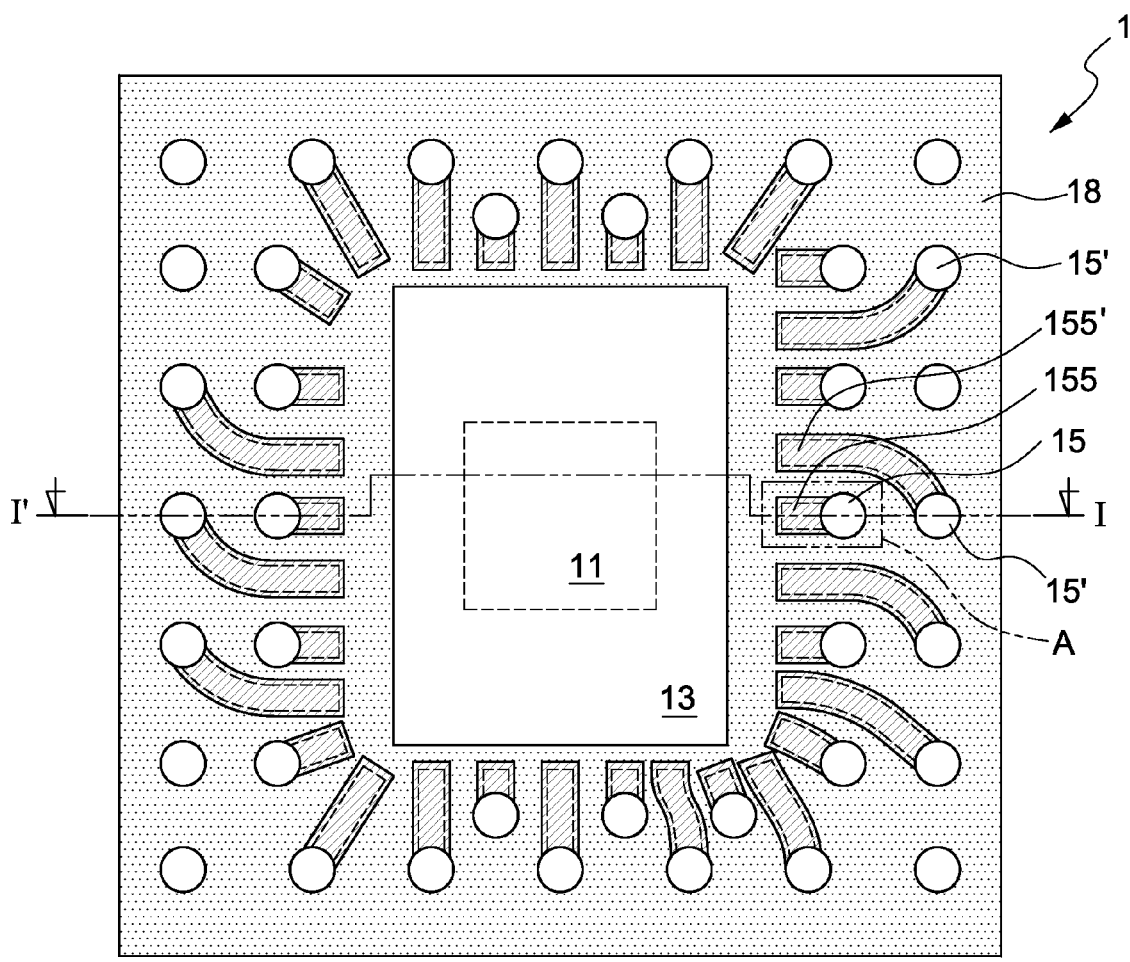
FIG. 1A is a bottom plane view of a semiconductor package according to an embodiment of the present disclosure.

The following definitions apply to some of the aspects described with respect to some embodiments of the present disclosure. These definitions may likewise be expanded upon herein.

As used herein, the singular terms "a," "an," and "the" include plural referents unless the context clearly dictates otherwise. Thus, for example, reference to a lead can include multiple leads unless the context clearly dictates otherwise.

As used herein, the term "adjacent" refers to being near or adjoining. Adjacent components can be spaced apart from one another or can be in actual or direct contact with one another. In some instances, adjacent components can be connected to one another or can be formed integrally with one another.

As used herein, relative terms such as "inner," "interior," "outer," "exterior," "top," "bottom," "front," "back," "upper," "upwardly," "lower," "downwardly," "vertical," "vertically," "lateral," "laterally," "above," and "below" refer to an orientation of a set of components with respect to one another, such as in accordance with the drawings, but do not require a particular orientation of those components during manufacture or use.

As used herein, the terms "connect," "connected," and "connection" refer to an operational coupling or linking. Connected components can be directly coupled to one another or can be indirectly coupled to one another, such as through another set of components.

As used herein, the terms "about," "substantially" and "substantial" refer to a considerable degree or extent. When used in conjunction with an event or circumstance, the terms can refer to instances in which the event or circumstance occurs precisely as well as instances in which the event or circumstance occurs to a close approximation, such as accounting for typical tolerance levels of the manufacturing methods described herein. For example, the terms can refer to less than or equal to ±10%, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. In some embodiments, two surfaces can be deemed to be coplanar or substantially coplanar if a displacement between the two surfaces is small, such as no greater than 1 µm, no greater than 5 µm, or no greater than 10 µm.

Additionally, amounts, ratios, and other numerical values are sometimes presented herein in a range format. It is to be understood that such range format is used for convenience and brevity and should be understood flexibly to include numerical values explicitly specified as limits of a range, but also to include all individual numerical values or sub-ranges encompassed within that range as if each numerical value and sub-range is explicitly specified.

The present disclosure describes semiconductor packages and methods of making the semiconductor packages, in which an electrically insulating material is used to cover exposed traces to prevent short circuits. The insulating material is applied by inkjet printing in some embodiments.

As can be seen in the figures of this disclosure, the manufacturing techniques described provide a benefit of thin packaging. A package manufactured according to these manufacturing techniques may have one or more exposed lead traces. In some embodiments, lead traces may be positioned close to each other and close to other lead portions that are also exposed. Thus, if the lead traces are exposed, there is a possibility that interconnection elements (such as solder balls) that are disposed on exposed lead portions may unintentionally extend to neighboring exposed lead traces and cause short circuits between the exposed lead portions and the neighboring exposed lead traces. To prevent such short circuits from occurring, the manufacturing techniques include covering exposed lead traces with an insulating material.

A molding compound of the package fills spaces between leads; additionally, an extended portion of the molding compound serves to separate exposed lead traces and exposed lead portions from each other. In some embodiments, an application of the insulating material may be controlled to selectively cover the exposed lead traces while substantially leaving the molding compound exposed, because the molding compound itself may be an electrical insulator, and a further application of insulating material may be unnecessary. Thus, in some embodiments, the controlled application of the insulating material allows for an application of insulating material on the exposed lead traces where insulation is useful to prevent short circuits, while providing a benefit of saving manufacturing time and cost by not extending the application of the insulating material over the molding compound. It should be noted, however, that in some embodiments, the insulating material is applied to intentionally cover portions of, or all of, the molding compound exposed between the lead traces and lead portions.

As described below, the geometry and materials of a semiconductor package manufactured according to the techniques described in this disclosure provide a benefit in that the geometry and materials may be used to guide the insulating material in a liquid stage for the desired coverage.

A further benefit of the controlled application of the insulating material is that, as described below for an exposed lead trace that joins with an exposed lead portion, a portion of the exposed lead trace may be left uncovered by the insulating material to allow an interconnection element increased available surface area over which to make a physical and electrical connection.

These and other benefits will be apparent from the following discussions and the figures.

Figure 1B:
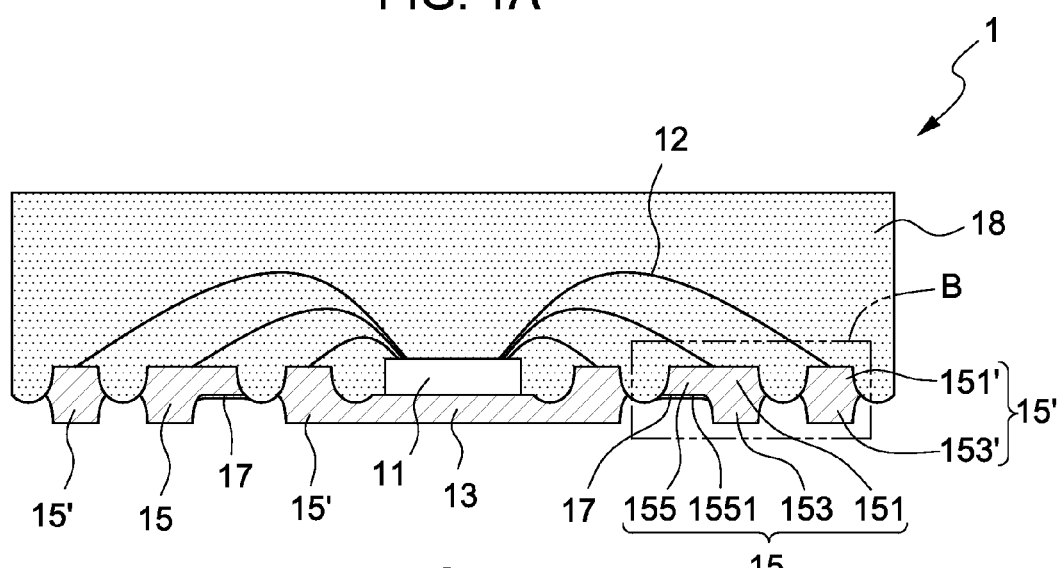
FIG. 1B is a cross-sectional view along line I-I' in FIG. 1A.

Referring to FIGS. 1A and 1B, a bottom plane view and a cross-sectional side view, respectively, of a semiconductor package according to one embodiment of the present disclosure are illustrated. The cross-section of the semiconductor package 1 shown in FIG. 1B is taken along the line I-I' in FIG. 1A.

With reference to FIGS. 1A and 1B, the semiconductor package 1 of this embodiment includes a chip 11, a die pad 13, a plurality of bonding wires 12, a plurality of leads 15, 15', and a molding compound 18. The leads 15, 15' substantially surround the die pad 13 and serve as contacts for electrically connecting the chip 11 to external circuits, such as other semiconductor devices or a printed circuit board. Each lead 15, 15' has an inner lead portion 151, 151' and an outer lead portion 153, 153', wherein the outer lead portion 153, 153' connects to the inner lead portion 151, 151'. In addition, at least one lead 15, 15' further comprises a trace portion 155 (it should be understood that trace portion 155 in FIG. 1B may be representative, for example, of trace portion 155 or trace portion 155' in FIG. 1A). Trace portion 155 extends from one side of the inner lead portion 151. The trace portion 155 of lead 15 illustrated in FIG. 1B further has a first surface 1551 at its bottom, and the first surface 1551 is adjacent to the intersection of the inner lead portion 151 and the outer lead portion 153.

The chip 11 is attached to the die pad 13, and the bonding wires 12 electrically connect the chip 11 to the outer lead portions 153, 153' of respective leads 15, 15', as follows, with reference to FIGS. 1A and 1B. The trace portions 155 of leads 15 electrically connect to the bonding wires 12 and the inner lead portions 151, and physically extend horizontally from an area near the die pad 13 to an inner ring of outer lead portions 153; the trace portions 155' of leads 15' electrically connect to the bonding wires 12 and the inner lead portions 151', and physically extend horizontally from an area near the die pad 13 to an outer ring of outer lead portions 153' in an area near the peripheral edge of the package 1. The bonding wires 12, the trace portions 155, 155' and the inner lead portions 151, 151' constitute an electrical wiring to achieve the electrical connection between the die 13 and the outer lead portions 153, 153'.

The trace portions 155, 155' may be patterned to provide for circuit design flexibility of the semiconductor package 1. Such circuit design flexibility also allows the outer lead portions 153, 153' to be flexibly positioned to align with corresponding mounting locations, such as specific pads on a printed circuit board or other device. Additionally, the trace portions 155, 155' provide an intermediate to bridge the bonding wires 12 and the inner lead portions 151, 151', so that the length of the bonding wires 12 may be limited; further, the arc heights of the bonding wires 12 may be controlled and thus the total thickness of the package 1 can be reduced.

With continued reference to FIGS. 1A and 1B, the molding compound 18 encapsulates the chip 11 and the bonding wires 12, and partially encapsulates the leads 15, 15'. The outer lead portions 153, 153' and the first surface 1551 of the trace portion 155 are exposed from the molding compound 18. In this way, the inner lead portions 151, 151' are fully encapsulated within the molding compound 18, and the outer lead portions 153, 153' substantially protrude from the bottom surface of the molding compound 18. In addition, an insulating layer 17 is formed on the first surface 1551 of the trace portion 155 by, for example, inkjet printing. The insulating layer 17 substantially covers the first surface 1551 of the trace portion 155. The material of the insulating layer 17 comprises non-conductive materials such as, for example, epoxy resin or solder resist, or other polymeric or non-polymeric insulating materials.

Figure 2A:
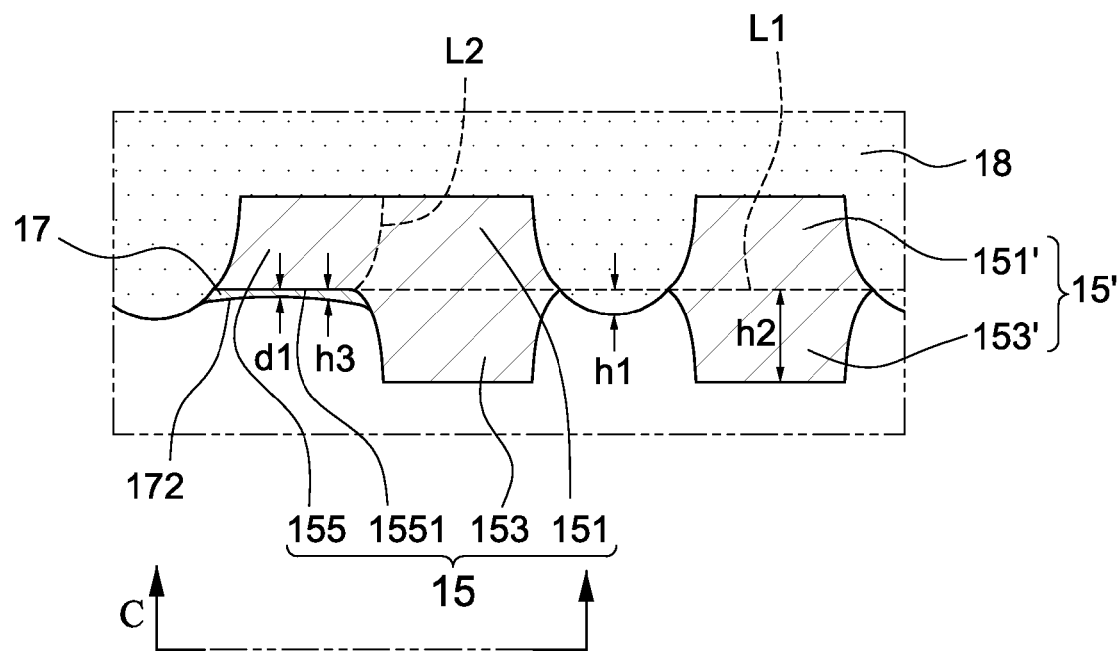
FIG. 2A is an enlarged view of portion "B" in FIG. 1B.

FIG. 2A is an enlarged view of portion "B" in FIG. 1B, wherein dotted lines L1 and L2 are (imaginary) auxiliary lines used in the illustration for clarity, to differentiate the inner lead portion 151, 151', outer lead portion 153, 153', and trace portion 155. The auxiliary line L1 intersects the interfaces between the sloped sidewalls of the inner lead portions 151, 151' and the sloped sidewalls of the outer lead portions 153, 153'. The auxiliary line L2 distinguishes the inner lead portion 151 and the trace portion 155.

With further reference to FIG. 2A, the molding compound 18 extends by a height h1 past the auxiliary line L1 and past the first surface 1551 of the trace portion 155 due to the twofold etching steps in the manufacturing process of the semiconductor package 1. The height h1 is less than or equal to about 70 micrometers (µm). For example, the height h1 may be less than or equal to about 65 µm, less than or equal to about 60 µm, less than or equal to about 55 µm, or less than or equal to about 50 µm. A height h2 of the outer portion 153, 153' is greater than the height h1. As mentioned above, the insulating layer 17 may be formed on the first surface 1551 of the trace portion 155 by inkjet printing. During forming, the insulating layer 17 will spread onto the portion of the molding compound 18 extending past the auxiliary line L1 and past the first surface 1551 of the trace portion 155 due to capillary action of the intermolecular forces between the liquid-state material of the insulating layer 17 and the molding compound 18 in a solid state. The area over which the insulating layer 17 spreads in the liquid state is controlled, to limit the spread of the insulating material 17 onto the outer lead portions 153 and onto the molding compound 18 extending past the auxiliary line L1 and past the first surface 1551 of the trace portion 155. In this way, the insulating layer 17 exposes an uncovered portion of the molding compound 18. Thus, the insulating layer 17 not only covers the first surface 1551 of the outer lead portion 155, but also partially covers the portion of the molding compound 18 extending past the first surface 1551 of the trace portion 155.

As shown in FIG. 2A, the insulating layer 17 comprises a second surface 172 opposite to the first surface 1551 of the trace portion 155. Due to the capillary action noted above, the profile of the insulating layer 17 is concave. A minimum distance d1 between the second surface 172 of the insulating layer 17 and the first surface 1551 of the trace portion 155, as shown in the cross-section view of FIG. 2A, is in a range between about 10 µm and about 24 µm. Because the insulating layer 17 partially covers a portion of the molding compound 18 extending past the first surface 1551 of the trace portion 155, the second surface 172 intersects the molding compound 18 extending past the first surface 1551 of the trace portion 155. In view of the above, the height h2 of the outer lead portion 153 is greater than any height h3 between the concave second surface 172 of the insulating layer 17 and the first surface 1551 of the trace portion 155, and the height h3 is less than the height h1 of the portion of the molding compound 18 extending past the first surface 1551 of the trace portion 155.

Figure 2B:
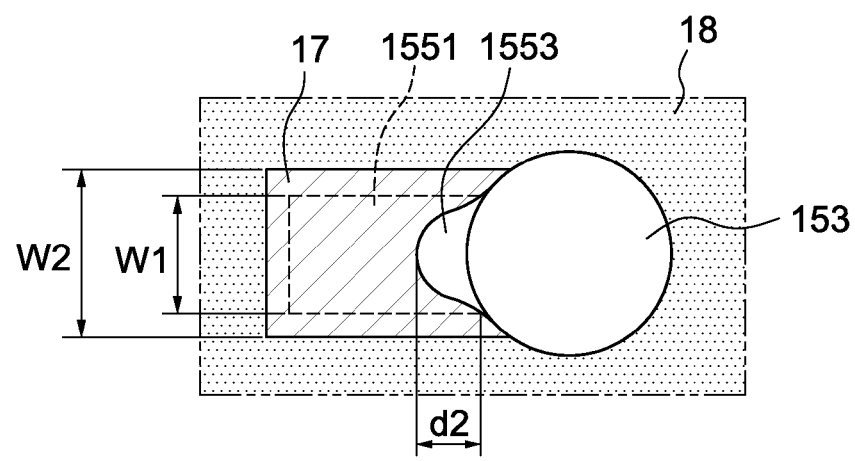
FIG. 2B is a bottom plane view of portion "A" in FIG. 1A or "C" in FIG. 2A.

FIG. 2B is a bottom plane view of portion "A" in FIG. 1A or "C" in FIG. 2A, shown with a formation of the insulating layer 17 according to an embodiment of the disclosure.

With reference to FIG. 2B, an area 1553 of the first surface 1551 of the trace portion 155 is exposed from the insulating layer 17, and the exposed area 1553 is adjacent to the outer lead portion 153. The exposed area 1553 is formed during the formation of the insulating layer 17. While printing the liquid-state material of the insulating layer 17 on the first surface 1551 of the trace portion 155 to form the insulating layer 17, the liquid-state material of the insulating layer 17 may be controlled to substantially cover the first surface 1551 of the trace portion 155 but not contact the periphery of the outer lead portion 153. During printing, the liquid-state material is selectively printed on a portion of the first surface 1551 of the trace portion 155. For example, printing may begin from the end of the trace portion (far left edge as illustrated in FIG. 2B) and stop at a distance from the periphery of the outer lead portion 153. Due to the capillary action described above, some volume of liquid-state insulating layer 17 may extend over some areas of molding compound 18 and cause the insulating material 17 to expose a portion of the trace portion 155, particularly a portion adjacent to the outer lead portion 153. After the liquid-state material of the insulating layer 17 is completely cured, the insulating layer 17 is fixedly formed and the exposed area 1553 is defined.

It has been determined that, once the insulating layer 17 is cured, a distance d2 between the insulating layer 17 on the first surface 1551 of the trace portion 155 and the periphery of the outer lead portion 153 is preferably no greater than about a width W1 of the first surface 1551 of the trace portion 155. Thus, the printing is controlled to account for the capillary action. The distance d2 of the exposed area 1553 is substantially greater than zero (e.g., substantially greater than 1% of W1). In addition, because the portions of the molding compound 18 extending past the first surface 1551 of the trace portion 155 are partially covered by the insulating layer 17 as well, when viewed from the bottom, a width W2 of the insulating layer 17 will be greater than or equal to the width W1 of the first surface 1551 of the trace portion 155. A ratio of the width W2 of the insulating layer 17 to the width W1 of the first surface 1551 of the trace portion 155 is in a range of about 1:1 to about 1.5:1.

Figure 3A:
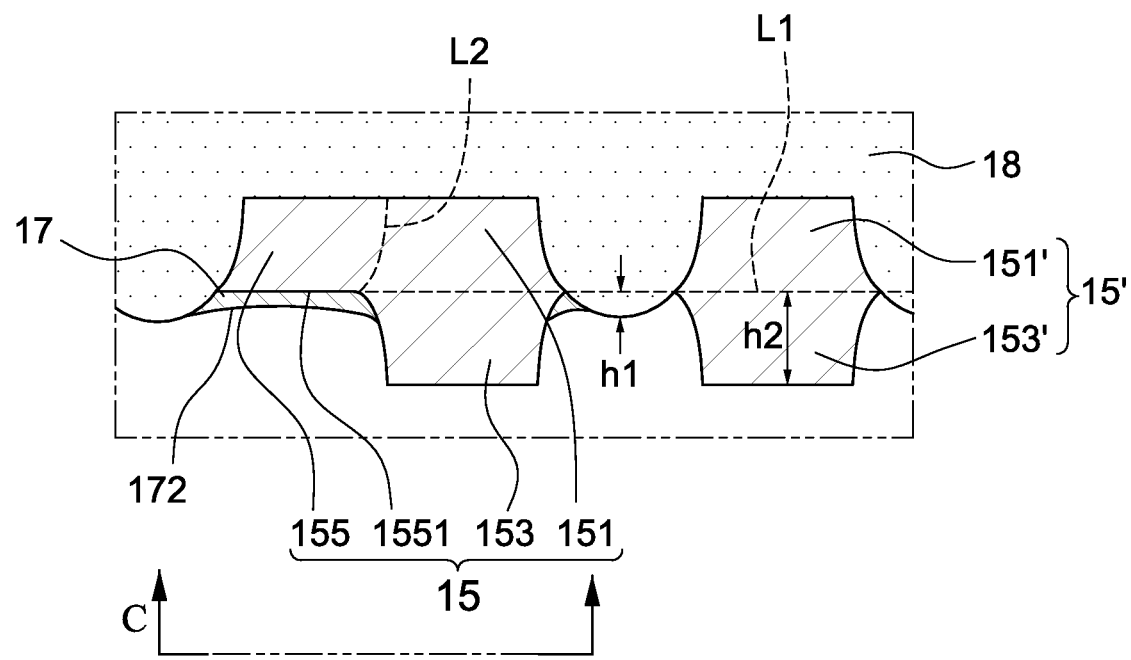
FIG. 3A is another enlarged view of portion "B" in FIG. 1B.
Figure 3B:
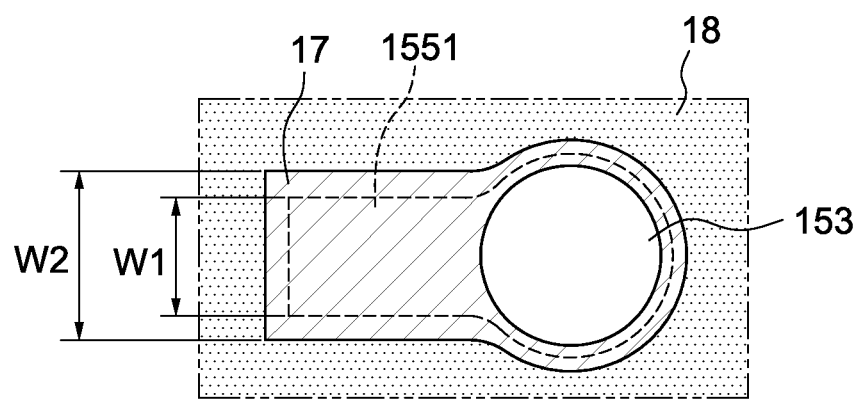
FIG. 3B is another bottom plane view of portion "A" in FIG. 1A or "C" in FIG. 3A.

FIG. 3A is also an enlarged view of portion "B" in FIG. 1B, and FIG. 3B is a bottom plane view of portion "A" in FIG. 1A or "C" in FIG. 3A. FIGS. 3A and 3B are similar to FIGS. 2A and 2B, respectively, except that the insulating layer 17 extends around the periphery of the outer lead portion 153, and thus there is not an exposed area 1553 as shown in FIG. 2B.

As shown in FIG. 3A and FIG. 3B, the liquid-state material of the insulating layer 17 may be printed on substantially the whole first surface 1551 of the trace portion 155. For example, printing may begin from the end of the trace portion 155 and stop close to the periphery of the outer lead portion 153, and, due to the capillary action described above, some volume of the liquid-state insulating layer 17 may extend over some areas of the molding compound 18 and may also extend over part of the periphery of the outer lead portion. In this manner, the liquid-state material of the insulating layer 17 may be controlled to cover substantially the whole first surface 1551 of the trace portion 155. Correspondingly, the minimum distance between the second surface 172 of the insulating layer 17 and the first surface 1551 of the trace portion 155 is increased (e.g., as compared to distance d1 in FIG. 2A).

FIG. 4A to FIG. 4E are cross-sectional views showing a method of manufacturing a semiconductor package according to one embodiment of the present disclosure.

Figure 4A:
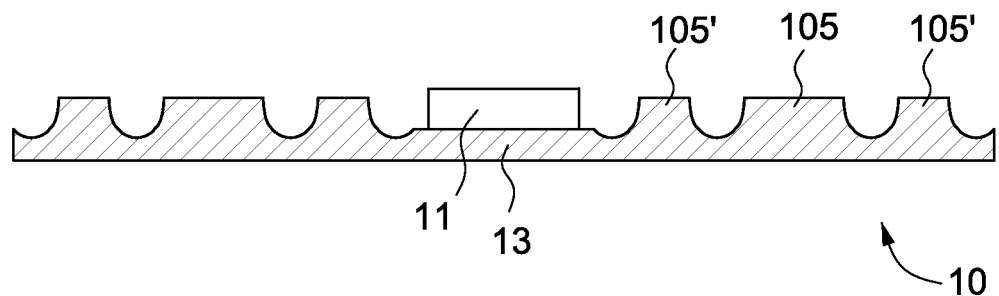
FIGS. 4A, 4B, 4C, 4D and 4E are cross-sectional views showing a method of manufacturing a semiconductor package according to an embodiment of the present disclosure.

With reference to FIG. 4A, a lead frame 10, which is formed by an etching process, is provided. The lead frame 10 includes a die pad 13 and a plurality of semi-manufactured leads 105, 105' surrounding the die pad 13. Further, a chip 11 is attached to the die pad 13 and may be electrically connected to the die pad 13.

Figure 4B:
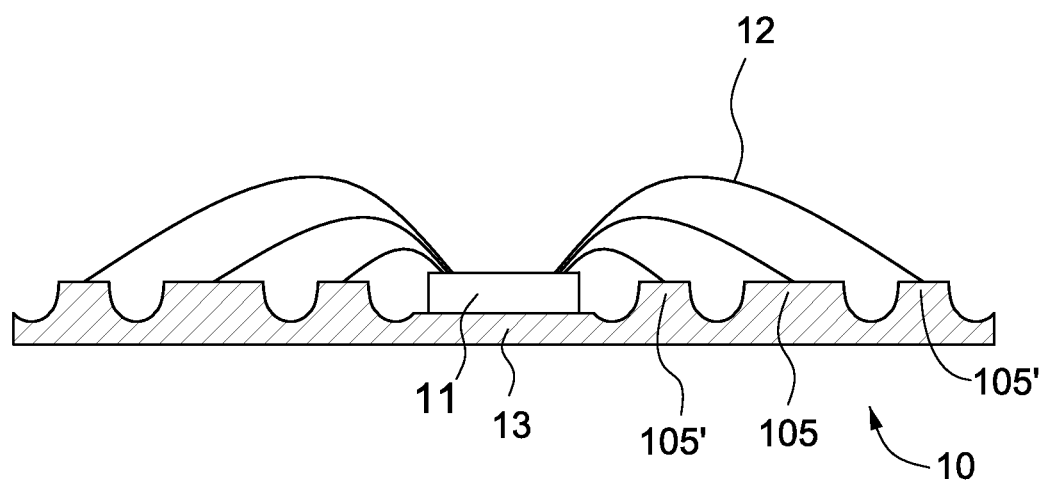

With reference to FIG. 4B, the chip 11 is electrically connected to the semi-manufactured leads 105, 105' through bonding wires 12.

Figure 4C:
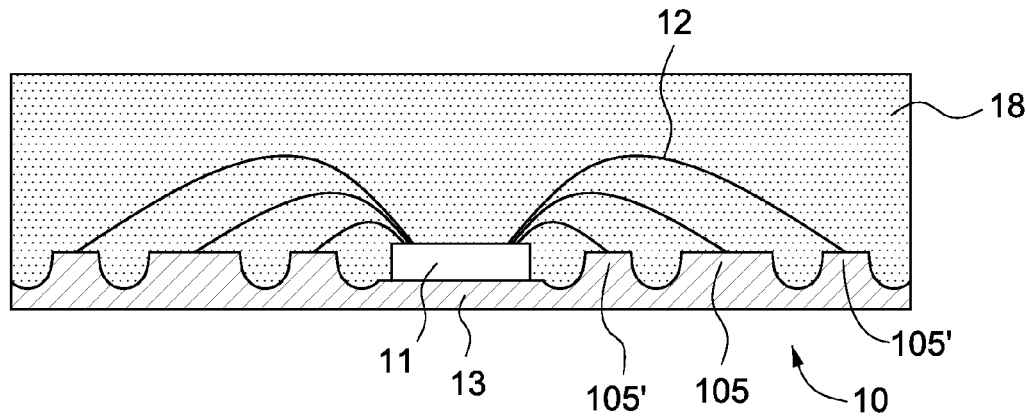

With reference to FIG. 4C, a molding process forms a molding compound 18 to cover the chip 11, the die pad 13, the bonding wires 12 and the semi-manufactured leads 105, 105'. In particular, the molding compound 18 fills spaces between the adjacent semi-manufactured leads 105, 105' and between the die pad 13 and the semi-manufactured leads 105, 105'.

Figure 4D:
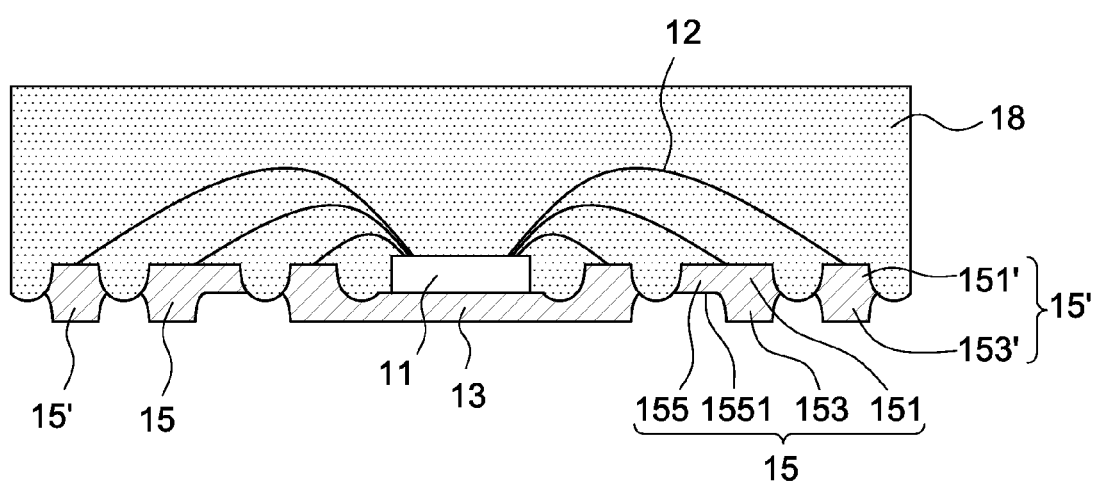

With reference to FIG. 4D, the lead frame 10 is processed by another etching process such that the semi-manufactured leads 105, 105' become the finished leads 15, 15', respectively. Each of the leads 15, 15' comprises respective inner lead portions 151, 151' and respective outer lead portions 153, 153', wherein the inner lead portions 151, 151' are encapsulated within the molding compound 18 and the outer lead portions 153, 153' are exposed from the molding compound 18. Further, at least one lead 15 (or lead 15', as described above) comprises a trace portion 155, wherein the trace portion 155 is encapsulated by the molding compound 18, but a first surface 1551 of the trace portion 155 is exposed from the molding compound 18. In addition, because the lead frame 10 is further etched after the molding compound 18 has been formed and fills the spaces between adjacent leads, and because the materials of the lead frame 10 and the molding compound 18 have different resistance to the etching agents, the molding compound 18 extends past the first surface 1551 of the trace portion 155.

Figure 4E:
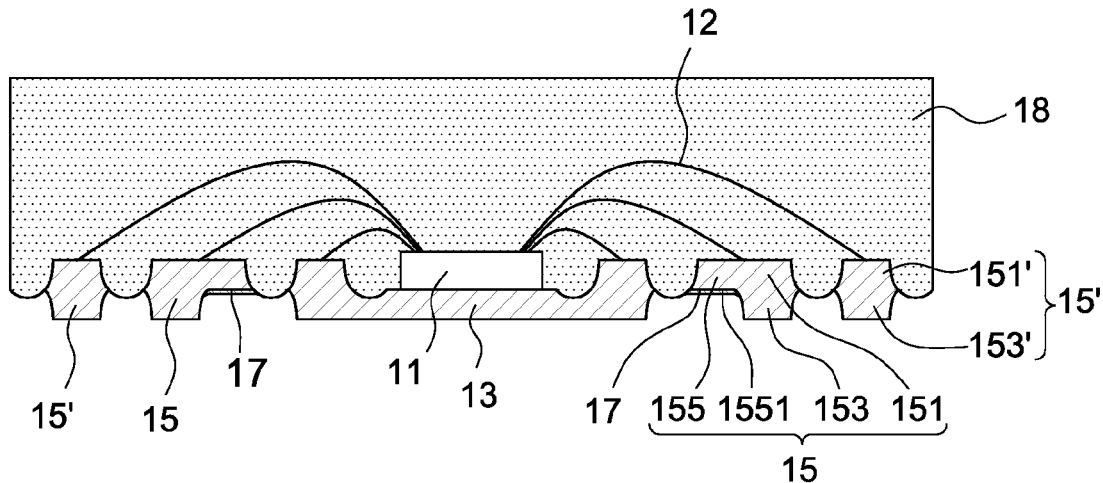

With reference to FIG. 4E, the liquid material of the insulating layer 17 may be inkjet printed on some or all of the first surface 1551 of the trace portion 155. After the insulating layer 17 is cured completely, the insulating layer 17 covers some or all of the first surface 1551 of the trace portion 155. Further, during the process of forming the insulating layer 17, the liquid-state material of the insulating layer 17 could be printed and cured alternately (i.e., repeatedly performing printing and curing until a desired insulating layer 17 is formed). Moreover, due to the capillary action, the liquid-state material may spread onto portions of the molding compound 18 extending past the first surface 1551 of the trace portion 155 and the outer lead portion 153, and thus the insulating layer 17 when cured may not only cover some or all of the first surface 1551 of the trace portion 155, but also may partially cover some of the molding compound 18 extending past the first surface 1551 of the trace portion 155. In such manner, a width W2 of the insulating layer 17 may be greater than a width W1 of the first surface 1551; additionally, the exposed area 1553 may be formed, as illustrated in the embodiment of FIG. 2B.

Figure 5:
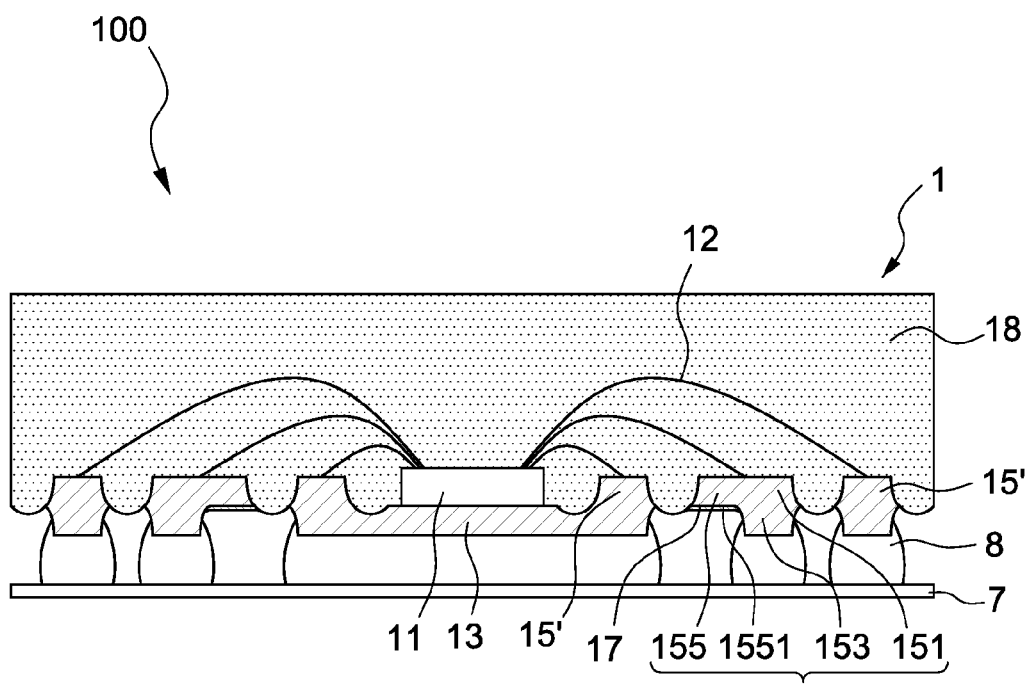
FIG. 5 is a cross-sectional side view of an electronic device including a semiconductor package according to an embodiment of the present disclosure.

FIG. 5 is a cross-sectional side view of an electronic device including a semiconductor package according to one embodiment of the present disclosure.

With reference to FIG. 5, a semiconductor device 100 comprises a semiconductor package 1 (e.g., the semiconductor package 1 of FIG. 1A) and a printed circuit board 7. The semiconductor package 1 is attached to the printed circuit board 7 by interconnection elements 8, where the interconnection elements 8 may be, for example, solder balls or solder pastes. The interconnection elements 8 physically connect to the outer lead portions 153, 153', the die pad 13, and the printed circuit board 7 such that the semiconductor package 1, the die 11, and the bonding wires 12 may be electrically connected to the printed circuit board 7. In addition, the interconnection elements 8 which connect to a lead 15 (or 15' as described above) with a trace portion 155 may further contact an exposed area 1553 of the first surface 1551 of the trace portion 155 (refer to FIG. 2B).

With continued reference to FIG. 5, the interconnection elements 8 are arranged between the outer lead portions 153, 153' and the printed circuit board 7 so as to electrically connect the semiconductor package 1 to the printed circuit board 7. As shown in FIG. 5, each of the interconnection elements 8 has a large size relative to the distance between two adjacent leads 15, 15' due to the solder reflow process to interconnect the outer lead portions 153, 153' and the interconnection elements 8. Thus, when the interconnection elements 8 are arranged between the outer lead portions 153, 153' and the printed circuit board 7, the interconnection elements 8 may climb along the sloped sidewalls of the outer lead portions 153, 153' and further reach a trace portion (e.g., trace portion 155) of an adjacent lead 15, 15'. If the volume of the interconnection elements 8 is not well controlled, an interconnection element 8 may form a bridge (e.g., short circuit) between two leads (e.g., between lead 15 and lead 15'), thereby causing a malfunction of the electronic device 100. Referring to FIG. 1A and FIG. 1B, the pitch between two neighboring trace portions 155 is smaller than the pitch between two outer leads 153, 153'. To achieve higher input/output (I/O) counts to interconnect the die 11 and leads 15, 15', the pitch of the trace portions 155 may be reduced, which increases the risk of bridging neighboring leads through the interconnection elements 8. In order to solve the above technical problem, referring again to FIG. 5, the semiconductor package 1 further comprises an insulating layer 17 covering the first surface 1551 of the trace portion 155. In such manner, the insulating layer 17 will prevent the interconnection elements 8 from connecting to the trace portion 155 even though the interconnection elements 8 climb up the outer lead portions 153, 153'.

Figure 6A:
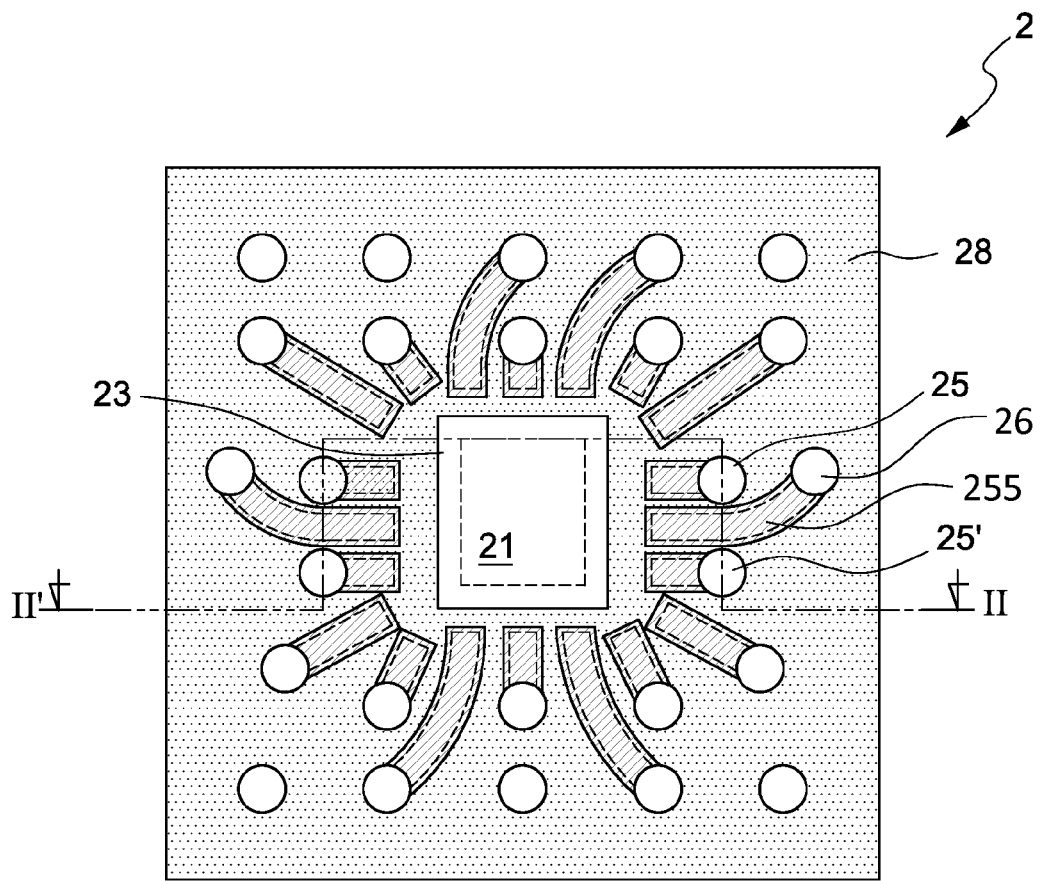
FIG. 6A is a bottom plane view of a semiconductor package according to an embodiment of the present disclosure.
Figure 6B:
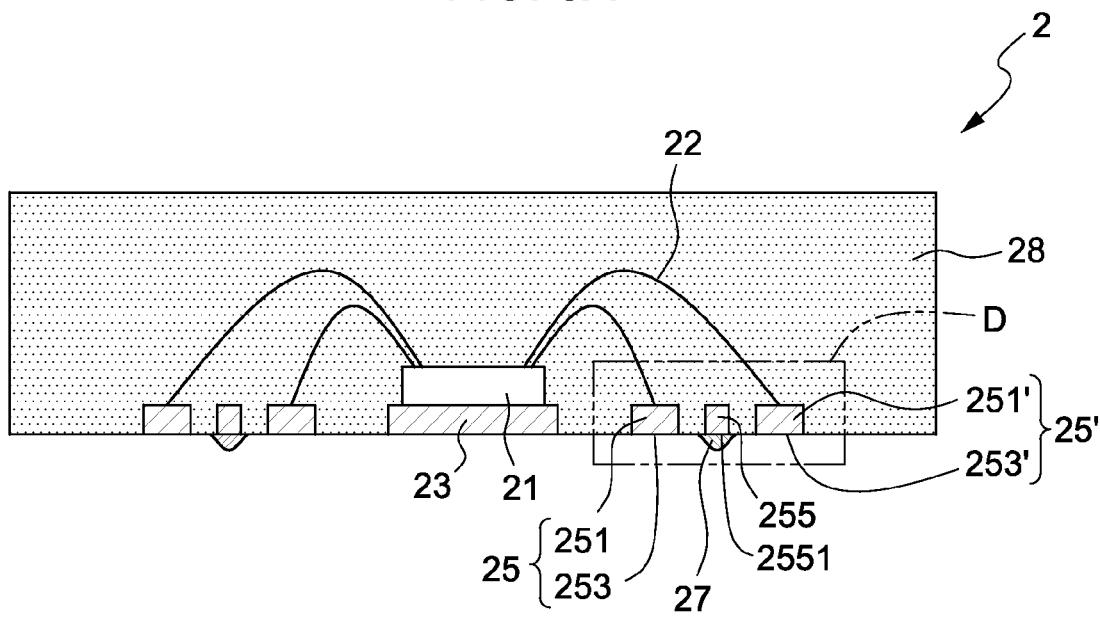
FIG. 6B is a cross-sectional side view of a semiconductor package according to an embodiment of the present disclosure.

Referring to FIG. 6A and FIG. 6B, a bottom plane view and a cross-sectional side view of a semiconductor package according to another embodiment of the present disclosure are illustrated. The cross-section of the semiconductor package 2 shown in FIG. 6B is taken along the line II-IF in FIG. 6A.

With reference to FIG. 6A, the semiconductor package 2 of this embodiment comprises a chip 21, a die pad 23, and a molding compound 28. The semiconductor package 2 further includes a plurality of leads with corresponding trace portions, which substantially surround the die pad 23 and serve as contacts for electrically connecting the chip 21 to external circuits, such as other semiconductor devices or a printed circuit board. Three leads along line II-IF are referred to as leads 25, 25' and 26. A trace associated with lead 26 is referred to as trace 255.

With reference to FIG. 6B, cross-sections of leads 25, 25', 26 are shown in an area D outlined by a dotted line; lead 26 is shown along a trace portion 255. As illustrated in FIG. 6B, leads 25, 25' have respective inner lead portions 251, 251' and outer lead portions with respective outer lead surfaces 253, 253'. The trace portion 255 has a first surface 2551 at its bottom, and the first surface 2551 is substantially coplanar with the outer lead surfaces 253, 253'. The semiconductor package 2 further comprises a plurality of bonding wires 22. The chip 21 is attached to the die pad 23 and is electrically connected to the leads 25, 25' through the bonding wires 22.

With continued reference to FIG. 6B, the molding compound 28 encapsulates the chip 21 and the bonding wires 22, and partially encapsulates the leads 25, 25' and the trace portion 255. The outer lead surfaces 253, 253' and the first surface 2551 of the trace portion 255 are exposed from the molding compound 28. In this way, the inner lead portions 251, 251' are totally encapsulated within the molding compound 18, and the outer lead surfaces 253, 253' and the first surface 2551 of the trace portion 255 are substantially coplanar with the bottom surface of the molding compound 28. In addition, an insulating layer 27 is formed on the first surface 2551 of the trace portion 255 by, for example, inkjet printing, and thus may substantially cover the first surface 2551 of the trace portion 255.

Figure 7:
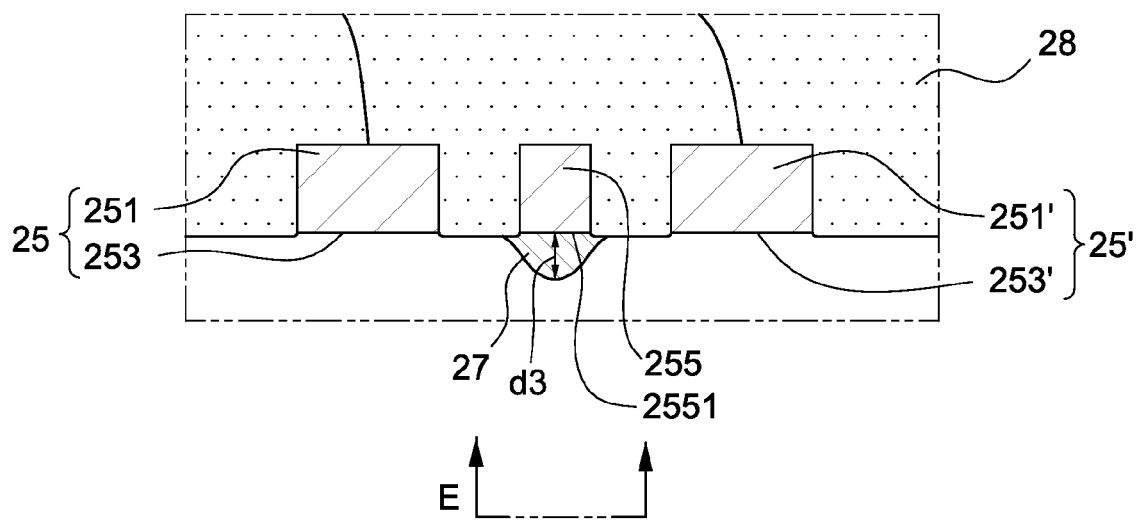
FIG. 7 is an enlarged view of portion "D" in FIG. 6B.

FIG. 7 is an enlarged view of portion "D" in FIG. 6B.

With reference to FIG. 7, the outer lead surfaces 253, 253' and the first surface 2551 of the trace portion 255 are substantially coplanar with the bottom surface of the molding compound 28. The molding compound 28 slightly extends past the outer lead surfaces 253, 253' and the first surface 2551 of the trace portion 255, because the materials of the leads and the molding compound have different resistance to etching agents. As mentioned above, the insulating layer 27 may be formed on the first surface 2551 of the trace portion 255 by inkjet printing. A largest thickness d3 of the insulating layer 27 on the first surface 2551 of the trace portion 255 is in a range from about 10 μm to about 24 μm.

Figure 8:
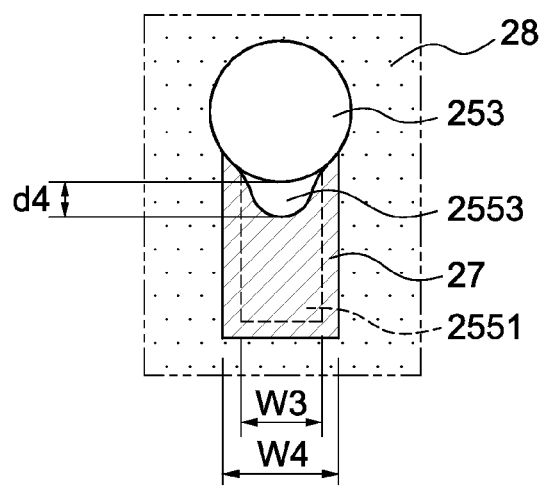
FIG. 8 is a bottom plane view of portion "E" in FIG. 7.

FIG. 8 is a bottom plane view of portion "E" in FIG. 7.

With reference to FIG. 8, an area 2553 of the first surface 2551 of the trace portion 255 is exposed from the insulating layer 27, and the exposed area 2553 is adjacent to the outer lead surface 253. The exposed area 2553 is caused by the formation of the insulating layer 27. While printing the liquid-state material of the insulating layer 27 on the first surface 2551 of the trace portion 255 to form the insulating layer 27, the liquid-state material of the insulating layer 27 may substantially cover the first surface 2551 of the trace portion 255 without contacting the periphery of the outer lead surface 253. During printing, the liquid-state material of the insulating layer 27 is selectively printed on a portion of the first surface 2551 of the trace portion 255. For example, printing may start from the end of the trace portion (the bottom of the trace portion 255 as illustrated in FIG. 8) and stop at a distance from the periphery of the outer lead portion, leaving exposed outer lead surface 253. During printing, due to capillary action, some volume of liquid-state insulating layer 27 may extend over areas of molding compound 28, and cause the exposure of a portion of the trace portion 255, particularly the exposure of the portion of the trace portion 255 adjacent to the outer lead surface 253. After the liquid-state material of the insulating layer 27 is completely cured, the insulating layer 27 is fixedly formed, and the exposed area 2553 is also formed.

It has been determined that a preferred distance between the cured insulating layer 27 on the first surface 2551 of the trace portion 255 and the periphery of the outer lead surface 253 is no greater than about the width W3 of the first surface 2551 of the trace portion 255. Thus, the printing is controlled to account for the capillary action such that a distance d4 of the exposed area 2553 from the outer lead surface 253 is controlled. The distance d4 is substantially greater than zero (e.g., substantially greater than 1% of W3), and preferably smaller than the width W3 of the first surface 2551 of the trace portion 255. In addition, because the insulating layer 27 partially covers the molding compound 28, when viewed from the bottom (see FIG. 8), a width W4 of the insulating layer 27 will be equal to or greater than the width W3 of the first surface 2551 of the trace portion 255. The ratio of the width W4 of the insulating layer 27 to the width W3 of the first surface 2551 of the trace portion 255 is in a range of about 1:1 to about 1.5:1.

FIG. 9A to FIG. 9E are cross-sectional views showing a method of manufacturing a semiconductor package, such as the semiconductor package illustrated in FIGS. 6A, 6B, 7 and 8, according to another embodiment.

Figure 9A:
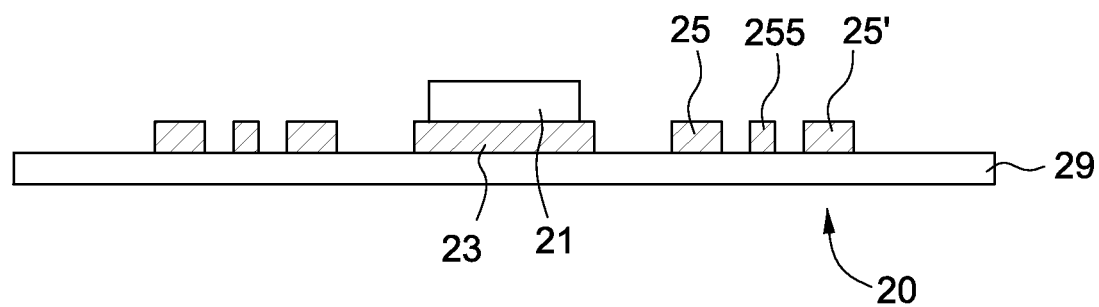
FIGS. 9A, 9B, 9C, 9D and FIG. 9E are cross-sectional views showing a method of manufacturing a semiconductor package according to an embodiment of the present disclosure.

With reference to FIG. 9A, a lead frame 20 is provided. The lead frame 20 includes a carrier 29, a die pad 23 and a plurality of leads (e.g., leads 25, 25', and the lead associated with the trace 255) surrounding the die pad 23. The die pad 23 and the leads are arranged on the top of the carrier 29. Further, a chip 21 is attached to the die pad 23 and may be electrically connected to the die pad 23.

Figure 9B:
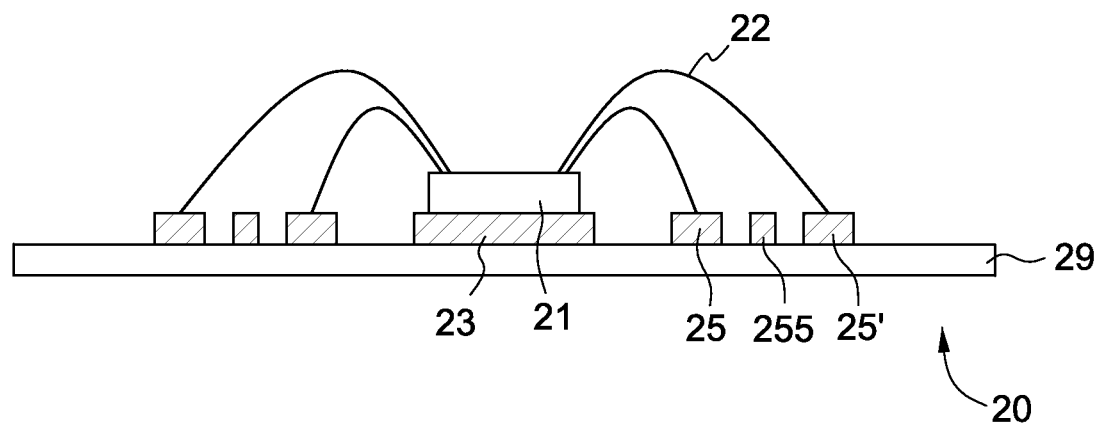

With reference to FIG. 9B, the chip 21 is electrically connected to the leads 25, 25' through the bonding wires 22.

Figure 9C:
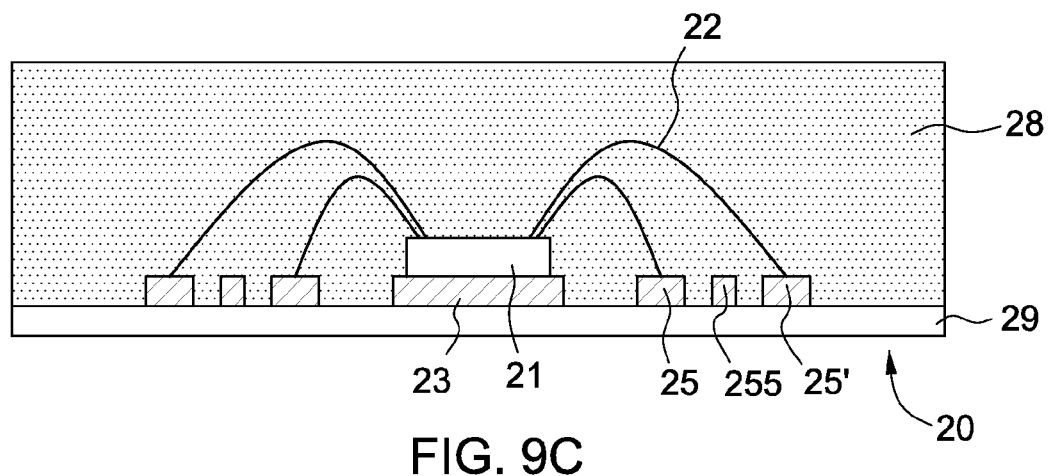

With reference to FIG. 9C, a molding process forms the molding compound 28 to cover the chip 21, the die pad 23, the bonding wires 22 and the leads (e.g., leads 25, 25' and the lead associated with trace 255). In particular, the molding compound 28 fills spaces between the leads and spaces between the die pad 23 and the leads.

Figure 9D:
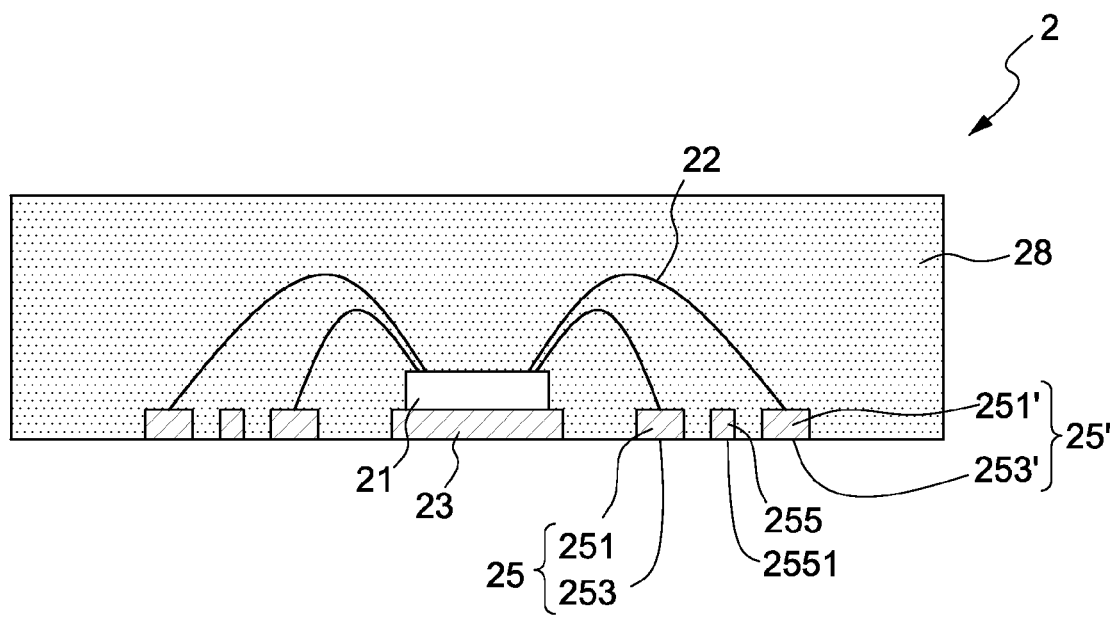

With reference to FIG. 9D, the lead frame 20 is etched such that the carrier 29 is removed from the die pad 21 and the leads (e.g., 25, 25'). In this way, each of the leads 25, 25' comprises a respective inner lead portion 251, 251' and outer lead portion with respective outer lead surface 253, 253', where the inner lead portions 251, 251' are encapsulated within the molding compound 28, and the outer lead surfaces 253, 253' are exposed from the molding compound 28. Further, the trace portion 255 is encapsulated by the molding compound 28, but a first surface 2551 of the trace portion 255 is exposed from the molding compound 28. In addition, the outer lead surfaces 253, 253' and the first surface 2551 of the trace portion 255 are substantially coplanar, and may be substantially coplanar with the bottom surface of the molding compound 28. The molding compound 28 may slightly extend past the outer lead surfaces 253, 253' and the first surface 2551 of the trace portion 255, because the materials of the leads and the molding compound have different resistance to etching agents.

Figure 9E:
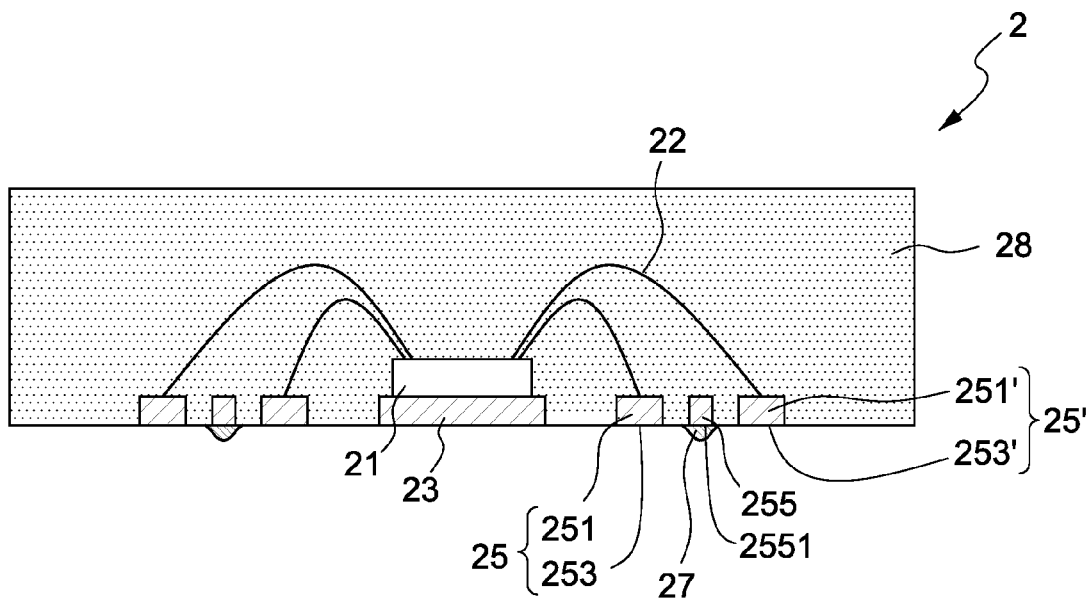

With reference to FIG. 9E, the liquid-state material of the insulating layer 27 is inkjet printed on the first surface 2551 of the trace portion 255. After the liquid-state material of the insulating layer 27 is cured completely, an insulating layer 27 is formed on the first surface 2551 of the trace portion 255 and covers some or all of the first surface 2551 of the trace portion 255. Further, during the process of forming the insulating layer, the liquid material of the insulating layer 27 could be printed and cured alternately (i.e., repeatedly performing printing and curing until a desired insulating layer 27 is formed). Moreover, due to capillary action, the liquid-state material may extend onto the molding compound 28 adjacent to the trace portion 255 and the outer lead surfaces 253, 253', and thus the insulating layer 27 may not only cover some or all of the first surface 2551 of the trace portion 255, but also may partially cover the molding compound 28 adjacent to the trace portion 255 after the liquid-state material of the insulating layer 27 is totally cured. In such manner, a width W4 of the insulating layer 27 may be greater than a width W3 of the first surface 2551 (FIG. 8); further, the exposed area 2553 may be formed (see, e.g., FIG. 8).

Figure 10:
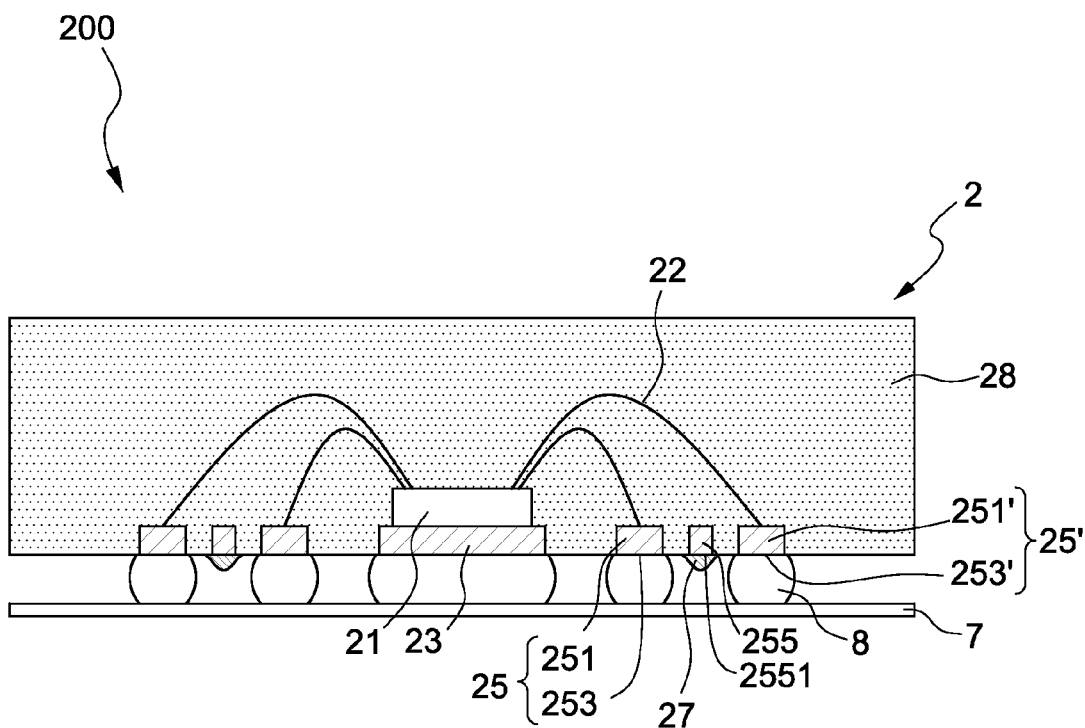
FIG. 10 is a cross-sectional side view of an electronic device including the semiconductor package according to an embodiment of the present disclosure.

FIG. 10 is a cross-sectional side view of an electronic device including a semiconductor package according to another embodiment.

With reference to FIG. 10, a semiconductor device 200 comprises the semiconductor package 2 illustrated in FIGS. 6A and 6B, and a printed circuit board 7. The semiconductor package 2 is attached to the printed circuit board 7 by interconnection elements 8, where the interconnection elements 8 may be, for example, solder balls or solder pastes. The interconnection elements 8 physically connect to the outer lead surfaces 253, 253', the die pad 23, and the printed circuit board 7 such that the semiconductor package 2, the die 21, and the bonding wires 22 may be electrically connected to the printed circuit board 7. In addition, the interconnect elements 8 that connect to the lead associated with the trace portion 255 may further contact an exposed area 2553 of the first surface 2551 of the trace portion 255 (refer to FIG. 8). Trace portions (e.g., trace portion 255 in FIG. 10, and more generally trace portions of the leads as shown in FIG. 6A) may be patterned to allow for flexible circuit design as well as flexible positioning of the outer lead surfaces 253, 253'; further flexibility of circuit design is provided by allowing wire bonding to the trace portions.

With continued reference to FIG. 10, the interconnection elements 8 are arranged between the outer lead surfaces 253, 253' and the printed circuit board 7 so as to electrically connect the semiconductor package 2 to the printed circuit board 7. As shown in FIG. 10, each of the interconnection elements 8 has a large size relative to the distance between two adjacent leads (e.g., in FIG. 10, between the outer lead surface 253 of lead 25 and the first surface 2551 of the trace portion 255, or between the first surface 2551 of the trace portion 255 and outer lead surface 253' of lead 25'; see also generally the distances between the leads illustrated in FIG. 6A). Thus, when the volume of interconnection elements 8 is not well controlled, an interconnection element 8 may form a bridge (e.g., a short circuit) between two neighboring leads, thereby causing a malfunction of the electronic device 200. Referring to FIG. 6A and FIG. 6B, the pitch between two neighboring trace portions is smaller than the pitch between two outer lead surfaces (e.g., 253, 253'). To achieve higher I/O counts to interconnect the die 21 and the leads, a pitch of the trace portions may be reduced, which increases the risk of bridging neighboring leads through the interconnection elements 8. In order to solve the above technical problem, the semiconductor package 2 further comprises the insulating layer 27 covering the first surface 2551 of the trace portion 255. In such manner, the insulating layer 27 will prevent the interconnection elements 8 from forming bridges between trace portions or more generally between leads.

While the disclosure has been described with reference to the specific embodiments thereof, it should be understood by those skilled in the art that various changes may be made and equivalents may be substituted without departing from the true spirit and scope of the disclosure as defined by the appended claims. In addition, many modifications may be made to adapt a particular situation, material, composition of matter, method, or process to the objective, spirit and scope of the disclosure. All such modifications are intended to be within the scope of the claims appended hereto. In particular, while the methods disclosed herein have been described with reference to particular operations performed in a particular order, it will be understood that these operations may be combined, sub-divided, or re-ordered to form an equivalent method without departing from the teachings of the disclosure. Accordingly, unless specifically indicated herein, the order and grouping of the operations are not limitations of the disclosure.

What is claimed is:

1. A semiconductor package, comprising:
a die pad;
a plurality of leads surrounding the die pad, wherein each of the leads comprises an inner lead portion and an outer lead portion, and wherein at least one lead further comprises a trace portion;
a chip disposed on the die pad and electrically connected to ones of the plurality of leads;
a molding compound encapsulating the chip, the inner lead portions and the trace portion, wherein the outer lead portions and a bottom surface of the trace portion are exposed from the molding compound; and
an insulating layer covering the bottom surface of the trace portion, and wherein the insulating layer further covers a portion of a bottom surface of the molding compound.

2. The semiconductor package of claim 1, wherein the insulating layer exposes an area of the bottom surface of the trace portion adjacent to the outer lead portion of the at least one lead.

3. The semiconductor package of claim 2, wherein the exposed area of the bottom surface of the trace portion is tapered from the outer lead portion to the insulating layer.

4. The semiconductor package of claim 3, wherein the distance between the end of the taper of the exposed area of the bottom surface of the trace portion and the periphery of the outer lead portion is smaller than a width of the bottom surface of the trace portion.

5. The semiconductor package of claim 1, wherein the insulating layer further exposes a portion of the bottom surface of the molding compound.

6. The semiconductor package of claim 1, wherein a ratio of a width of the insulating layer to a width of the bottom surface of the trace portion is in a range of 1:1 to 1.5:1.

7. The semiconductor package of claim 1, wherein the outer lead portion extends past the bottom surface of the molding compound.

8. The semiconductor package of claim 7, wherein the insulating layer has a bottom surface, and wherein a first height of the outer lead portion is greater than a second height between the bottom surface of the insulating layer and the bottom surface of the trace portion, and the second height is less than a third height of a portion of the molding compound extending past the bottom surface of the trace portion.

9. The semiconductor package of claim 1, wherein the outer lead portion is an exposed surface, which is substantially coplanar with the bottom surface of the molding compound.

10. An electronic device, comprising:
a semiconductor package, comprising:
a die pad;
a plurality of leads surrounding the die pad, wherein each of the leads comprises an inner lead portion and an outer lead portion, and wherein at least one lead further comprises a trace portion;
a chip disposed on the die pad and electrically connected to ones of the plurality of leads;
a molding compound encapsulating the chip, the inner lead portions and the trace portion, wherein the outer lead portions and a bottom surface of the trace portion are exposed from the molding compound; and
an insulating layer covering the bottom surface of the trace portion, and wherein the insulating layer further covers a portion of a bottom surface of the molding compound; and
a printed circuit board attached to the semiconductor package and electrically connected to the semiconductor package.

11. The electronic device of claim 10, wherein the outer lead portion protrudes from the bottom surface of the molding compound.

12. The electronic device of claim 10, wherein the outer lead portion is an exposed surface substantially coplanar with the bottom surface of the molding compound.

13. The electronic device of claim 10, further comprising at least one interconnection element physically connecting to the outer lead portion, physically connecting to the printed circuit board, and contacting with an exposed area of the trace portion.

14. The electronic device of claim 10, wherein the insulating layer further exposes a portion of the bottom surface of the molding compound.

15. An electronic device, comprising:
a molding compound;
a die pad protruding from a bottom surface of the molding compound;
a die disposed on the die pad, the die encapsulated by the molding compound;
a plurality of leads surrounding the die pad, each of the plurality of leads comprising an inner lead portion and an outer lead portion, the inner lead portion encapsulated by the molding compound and the outer lead portion protruding from the bottom surface of the molding compound, and at least one lead of the plurality of leads further comprises a trace portion exposed at the bottom surface of the molding compound;
a printed insulating layer formed on the trace portion, wherein the printed insulating layer covers a portion of the bottom surface of the molding compound; and
a plurality of wires, each wire bonded to the die and to one of the plurality of inner lead portions, the plurality of wires encapsulated by the molding compound.

16. The electronic device of claim 15, wherein multiple leads of the plurality of leads including the at least one lead each comprises a trace portion such that a plurality of trace portions are exposed by the molding compound.

17. The electronic device of claim 16, wherein the trace portions extend from an area near the die pad to an inner ring of outer lead portions or to an outer ring of outer lead portions, the outer ring near a periphery of the electronic device.

18. The electronic device of claim 16, wherein each outer lead portion includes an outer lead surface, and wherein a pitch between two neighboring trace portions is smaller than a pitch between two neighboring outer lead surfaces.

* * * * *